United States Patent [19]

Iijima et al.

[11] Patent Number: 5,867,029

[45] Date of Patent: *Feb. 2, 1999

[54] METHOD OF NONDESTRUCTIVE INSULATION TEST AND A NONDESTRUCTIVE INSULATION TESTING APPARATUS

[75] Inventors: Yasuo Iijima; Masahiro Tsubokawa, both of Takefu, Japan

[73] Assignee: Matsushita Electric Industrial Co., Ltd., Osaka, Japan

[ * ] Notice: The term of this patent shall not extend beyond the expiration date of Pat. No. 5,594,348.

[21] Appl. No.: 691,236

[22] Filed: Aug. 2, 1996

[30] Foreign Application Priority Data

Aug. 2, 1995 [JP] Japan ..................... 7-197354

[51] Int. Cl.$^6$ ................................. G01R 31/06
[52] U.S. Cl. ..................... 324/546; 324/557; 324/772
[58] Field of Search .................. 324/772, 546, 324/547, 551, 557, 523, 642

[56] References Cited

U.S. PATENT DOCUMENTS

| | | | |
|---|---|---|---|
| 2,948,849 | 8/1960 | Foster | 324/551 |
| 2,996,664 | 8/1961 | Vogel et al. | 324/551 |
| 3,775,686 | 11/1973 | Ganger et al. | 324/546 |
| 3,862,491 | 1/1975 | Richardson | 324/546 X |
| 3,887,866 | 6/1975 | Safer et al. | 324/546 |
| 3,932,806 | 1/1976 | Kawada | 324/546 |
| 5,594,348 | 1/1997 | Iijima et al. | 324/546 |

FOREIGN PATENT DOCUMENTS 549065  7/1993  Japan .

Primary Examiner—Michael Brock
Attorney, Agent, or Firm—Pollock, Vande Sande & Amernick

[57] ABSTRACT

A method of nondestructive insulation testing is disclosed which comprises the steps of: (a) placing an electric device, having a core and at least one winding provided on the core, in a reduced atmospheric pressure; (b) insulating the laminated core from the ground; (c) supplying a voltage signal having a first surge waveform to the winding; and detecting a glow discharge which may result from step (c) to detect an insulation condition of the winding, wherein the reduced atmospheric pressure ranges from 65 to 75 Torr and the voltage signal is applied in the first direction of the winding and then, is applied in the second, opposite, direction of the winding. This method may further comprise steps of: (d) supplying a second voltage signal having a second predetermined surge waveform having a peak voltage lower than a peak voltage of the predetermined surge waveform; (e) outputting a second output signal between the winding indicative of a second insulation condition of the winding in response to step (d); (f) measuring intervals corresponding to the wavelengths of the output signal and the second output signal respectively; and (g) judging the insulation condition by comparing the measured intervals to each other. A nondestructive insulation testing apparatus is also disclosed.

9 Claims, 10 Drawing Sheets

METHOD OF NONDESTRUCTIVE INSULATION TEST AND A NONDESTRUCTIVE INSULATION TESTING APPARATUS

BACKGROUND OF THE INVENTION

1. Field of the Invention

This invention relates to a method of nondestructive insulation testing of an electric apparatus, and a nondestructive insulation testing apparatus for nondestructively testing insulation of an electric apparatus.

2. Description of the Prior Art

There are various insulation tests for detecting scratches on surfaces of insulation coats on windings through applying an electric signal. The scratch may be generated by processes such as assembling windings with a laminated core. The scratch may cause a dielectric breakdown during running of an electric apparatus having a motor including its windings.

For example, a surge test applying a surge signal to a laminated core and windings provided to the laminated core at atmospheric pressure is known. This surge test can detect scratches apart from each other by less than 1 mm or a scratch apart from the laminated core by less than 1 mm.

A corona discharge test in the atmospheric pressure can detect scratches having a distance less than 1 mm therebetween or from the laminated core.

A reduction pressure corona discharge insulation test is also known. In this corona discharge insulation test, an ac voltage is supplied to the sample to be tested in a container where a pressure is lower than the atmospheric pressure in the condition that a corona discharge readily occurs in accordance with the Paschen's law to detect a scratch or the like on a surface of an insulation coat of a winding of a coil.

FIG. 7 is an illustration illustrating a prior art method of corona discharge insulation test. A motor coil 161 to be tested is placed in a tank 162. The pressure in the tank 162 is reduced by a vacuum pump 165 through a valve 164. A vacuum gauge 163 detects the pressure.

An ac voltage 168 is applied to the motor coil 161 through a bushing 166 and a laminated core 161a of the motor is coupled to a corona detector 610 through a bushing 167 and a filter 167. The corona detector 610 detects an amount of corona discharge.

FIG. 8 is an illustration of a prior art example of scratches on windings of coils.

Numeral 71 denotes the laminated core and supports coils 72. Scratches 73 and 74 are close to the laminated core 71 and the scratch 73 is close to the scratch 74 by one to two millimeters. Scratches 75 and 76 are about 30 millimeters apart from the laminated core 71 and the scratch 75 is close to the scratch 76.

The scratch 73 can be readily detected by detecting corona discharge in a reduced pressure with 300 to 500 volts. The scratch 74 is detected when a mode of the discharge changes from the corona discharge to the glow discharge by applying a high voltage from 700 to 1400 volts.

However, in such testing where the discharge is provided in a reduced pressure with application of an ac voltage having 60 Hz, an energy of the discharge is large, so that insulation at a peripheral portion of the scratch is destroyed considerably. Therefore, this test cannot be applied to a nondestructive test.

SUMMARY OF THE INVENTION

The aim of the present invention is to provide an improved a method of nondestructive insulation testing of an electric apparatus and an improved nondestructive insulation testing apparatus for nondestructively testing insulation of an electric apparatus.

According to this invention, a method of nondestructive insulation testing is provided which comprises the steps of: (a) placing an electric device, having a core and at least a winding provided to the core, in a reduced atmospheric pressure; (b) insulating the laminated core from the ground; (c), then, supplying a voltage signal having a surge waveform to at least the winding; and detecting a glow discharge which may have resulted from step (c) to detect an insulation condition of the winding.

In the method of nondestructive insulation testing, the reduced atmospheric pressure ranges from 1 to 100 Torr.

In the method of nondestructive insulation testing, the reduced atmospheric pressure ranges from 65 to 75 Torr with stability and accuracy.

In the method of nondestructive insulation testing, the voltage signal may be applied in the first direction of at least the winding and then, is applied in the second, opposite, direction of the winding.

The method of nondestructive insulation testing may further comprise steps of: (d) supplying a second voltage signal having a second predetermined serge waveform having a peak voltage lower than a peak voltage of the predetermined surge waveform; (e) outputting a second output signal between the winding indicative of a second insulation condition of the winding in response to step (d); (f) measuring intervals corresponding to wavelengths of the output signal and the second output signal respectively; and (g) judging the insulation condition through comparing the measured intervals to each other.

According to this invention a nondestructive insulation testing apparatus for detecting an insulation condition of an electric device, having at least one winding, insulated from the ground at a reduced atmospheric pressure is provided which comprises: a surge voltage signal supplying circuit for supplying a voltage signal having a predetermined surge waveform to the a winding; and a signal output circuit for outputting an output signal between the winding indicative of an insulation condition of the winding.

The nondestructive insulation testing apparatus further comprises a second surge voltage signal supplying circuit for supplying a second voltage signal having a second predetermined surge waveform having a second peak voltage lower than the peak voltage of the predetermined surge waveform. A signal output circuit outputs a second output signal between the winding indicative of a second insulation condition of the winding in response to the second surge voltage signal supplying circuit. A measuring circuit detects intervals corresponding to wavelengths of the output signal and the second output signal respectively, and a judging circuit judges the insulation condition by comparing the measured intervals to each other.

The nondestructive insulation testing apparatus may further comprise: a vacuum container for airtightly containing the electric device; a vacuum pump for generating the reduced atmospheric pressure in the vacuum container; and a holder for holding the electric device in a predetermined insulated condition from the ground. Moreover, the electric device may comprise a plurality of windings having lead wires and the vacuum container has a through hole for piercing the lead wires to couple the electric device to the surge signal generation circuit and the outputting circuit air-tightly.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Hereinbelow will be described an embodiment of this invention.

Figure 1:
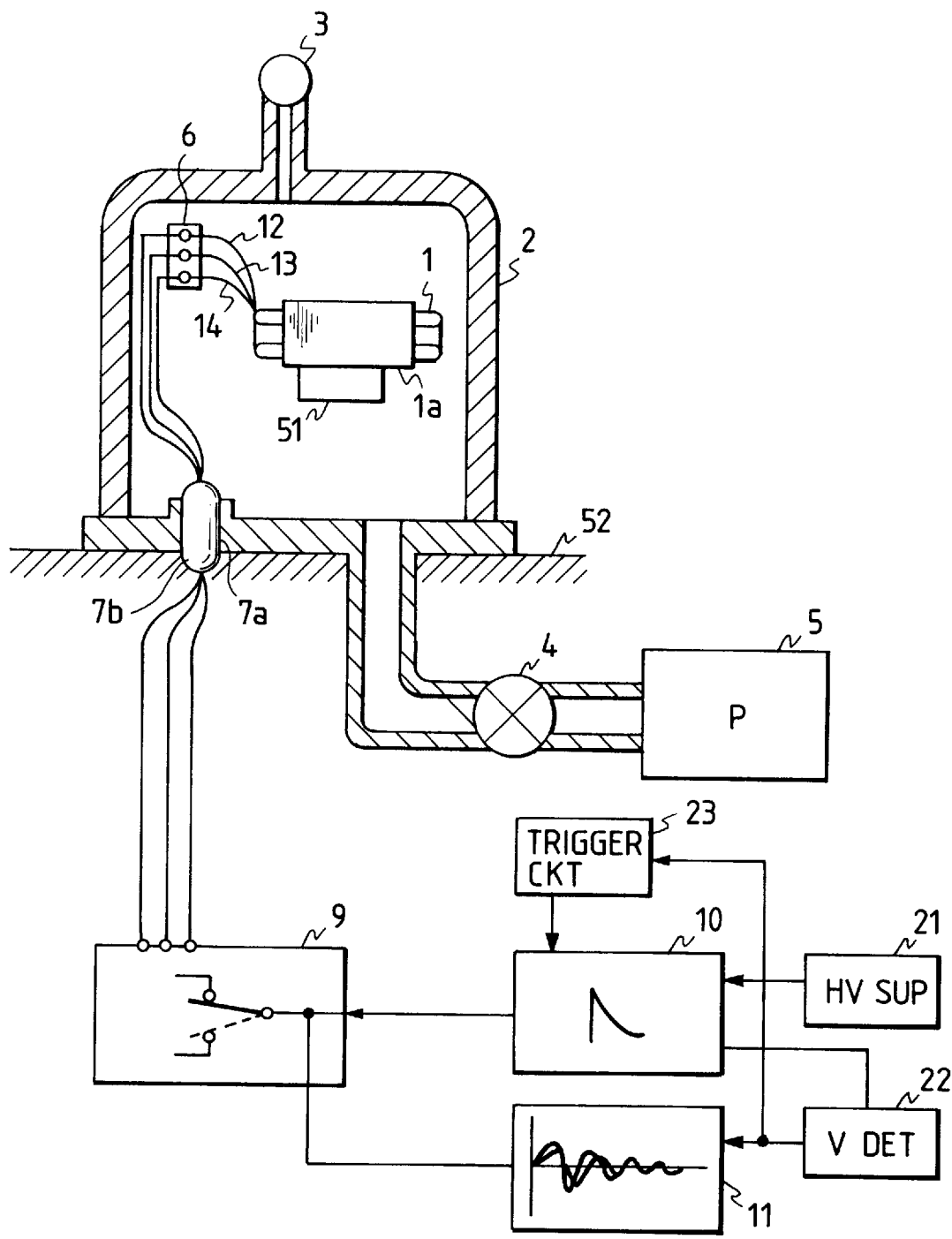
FIG. 1 is an illustration of an embodiment illustrating a method of nondestructive insulation testing method and a nondestructive insulation testing apparatus.

FIG. 1 is an illustration of the embodiment showing a method of nondestructive insulation testing method and a nondestructive insulation testing apparatus.

A motor 1, having leads (taps) 12 to 14, is placed in a vacuum container 2 at the atmospheric pressure. The leads 12 to 14 are connected to a switch circuit 9 via a terminal block 6 through a through hole 7a in the vacuum container 2 where a bushing 7b is provided for sealing. A vacuum pump 5 is communicated with the vacuum container 2 through a valve 4. The vacuum pump 5 reduces the pressure in the vacuum container 2 through the valve 4 while observing the vacuum pressure in the vacuum container 2 by a vacuum gauge 3. A surge signal generation circuit 10 generates a surge signal having a surge waveform from a supply voltage from a high voltage supply 21 with the supply voltage controlled to control a peak voltage of the surge signal. The switch circuit 9 supplies the surge signal between two adjacent leads out of the leads 12 to 14.

An observing circuit 11 observes a transient waveform between the two adjacent leads resulting from applying the surge signal therebetween. Observation or analysis of an output signal 61 with respect to its transient waveform resulting from applying the surge signal provides an insulation condition of the windings.

The laminated core 1a is insulated from the ground and the surge signal generation circuit 10 and the observing circuit 11 by a holder 51 for holding the motor 1 or by a mount 52 for mounting the vacuum container 2.

An operation will be described.

Figure 2:
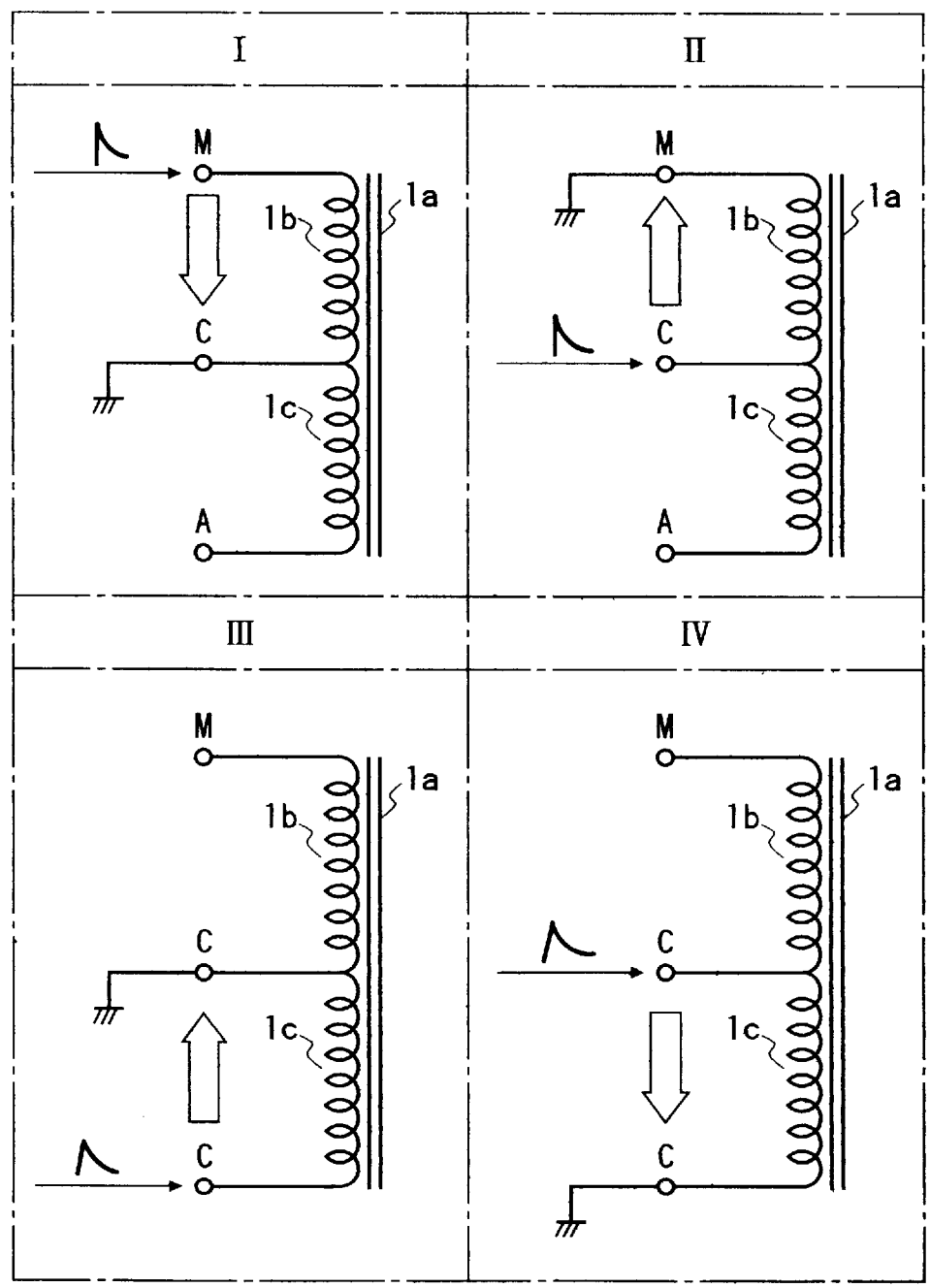
FIG. 2 is a diagram of connection patterns of this embodiment.
Figure 3:
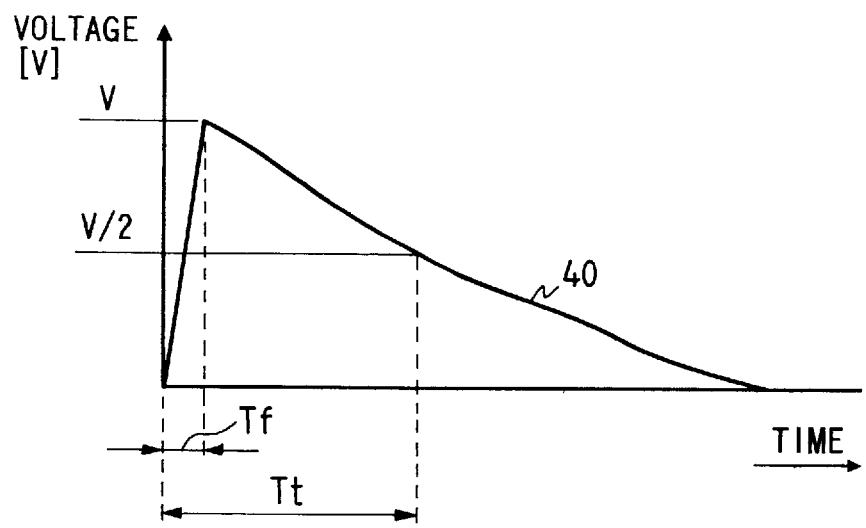
FIG. 3 is a graphical drawing of this embodiment showing a waveform of a surge signal.

FIG. 2 is a diagram of connection patterns of this embodiment. FIG. 3 is a graphical drawing of this embodiment showing a waveform of the surge signal.

The surge signal generated by the surge signal generation circuit 10 is applied to one of the windings. That is, one of the leads 12 to 14 is coupled to the output of the surge signal generation circuit 10 and another one of the leads 12 to 14 is coupled to the ground by the switch circuit 9. The remaining one of the leads 12 to 14 is open. The switch circuit 9 provides four connection patterns I to IV for the motor 1 having a main coil (winding) 1b having a tap M and a tap C and an auxiliary coil (winding) c having a tap A and a tap C which is a common tap to the main coil b. In the connection pattern I, the surge signal 40 is supplied to the main coil 1b from the tap M toward the tap C, that is, the ground. The laminated core 1a is insulated from the ground and the surge signal generation circuit 10 with its resistance to the ground is maintained at more than a predetermined value. In the connection pattern II, the surge signal is applied in the opposite direction with respect to the main coil 1b. That is, the surge signal is supplied to the main coil 1b from the tap C toward the tap M, that is, the ground by the switch circuit 9. In the connection patterns III and IV, the surge signal is applied to the auxiliary coil 1c bidirectionally. Therefore, the surge signal is applied to all coils bidirectionally.

The operation will be described more specifically.

In the connection pattern I, the surge signal flows from the tap M to the tap C which is a common tap between the main coil 1b and 1c. Stress due to the surge signal applied to the main coil 1b is generated between respective portions of the main coil 1b and points on the auxiliary coil 1c adjacent to the main coil. A surge energy disappears at the tap C. That is, there is no stress at the end of the main coil 1b near the tap C.

Then, in the connection pattern II, the surge signal flows from the tap C to the tap M. Stress due to the surge signal applied to the main coil 1b is generated between respective portions of the main coil 1b and points on the auxiliary coil 1c adjacent to the main coil 1b. The surge energy disappears at the tap M. That is, there is no stress at the end of the main coil 1b near the tap M. Therefore, the stress is generated uniformly over the main coil 1b and the auxiliary coil 1c because the surge signal is applied bidirectionally.

The connection patterns III and IV similarly provides the stress mainly to the auxiliary coil 1c and between the auxiliary coil 1c and the main coil 1b.

Then, any scratches on the main coil 1b and the auxiliary coil 1c can be detected.

A standard impulse of the surge signal shown in FIG. 3 has a wave front duration of Tf=1 to 3 $\mu$sec, and a wave tail duration Tt=40 $\mu$sec. This standard impulse provides extremely lower stress, so that this produces no corona discharge though there is a scratch. Therefore, the application of the reference impulse provides a reference transient waveform on the observation of the transient.

Before the measurement, the vacuum container 2 is evacuated to maintain the degree of vacuum from 65 to 75 Torr.

Figure 4:
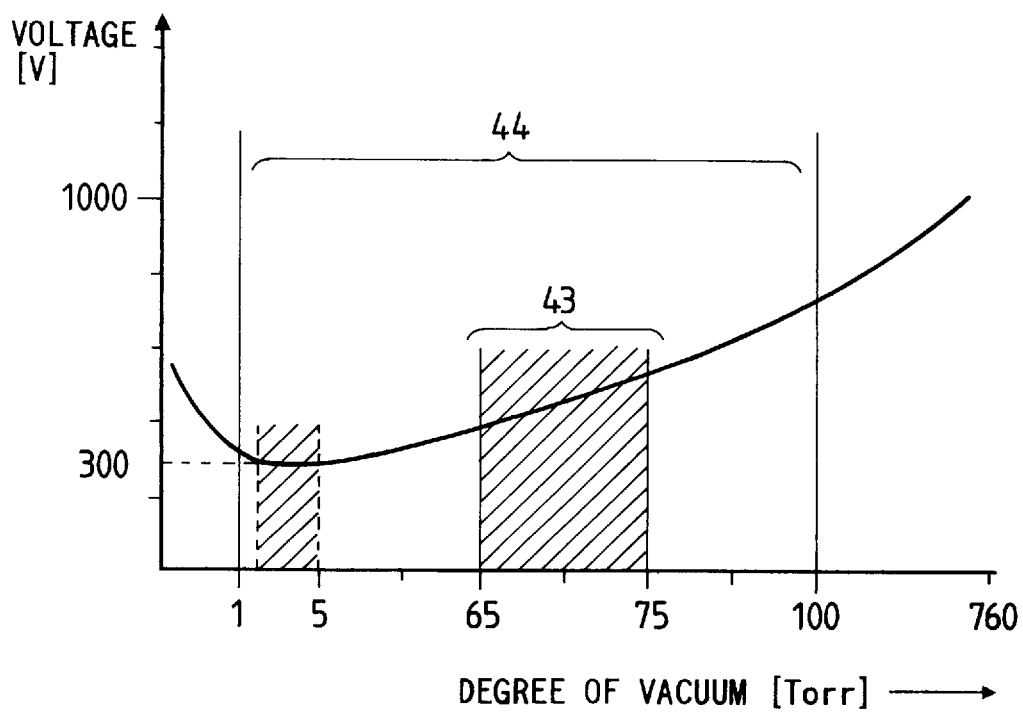
FIG. 4 is a graphical drawing of this embodiment showing a relation between a degree of vacuum and voltage for detection of discharge.

FIG. 4 is a graphical drawing of this embodiment showing a relation between a degree of vacuum and voltage for detection of discharge.

Generally, the corona discharge is observed in a reduced pressure of 1 to 5 Torr because a sensitivity to the corona discharge is high. However, in this region, the corona discharge is active, so that there is a large amount of corona which does not contribute to the detection of the insulation condition. In other words, there is a large amount of noise corona discharge in that region and the discharge at a scratch disappears in the background noise corona discharges so that a signal to noise ratio of the detection of the insulation condition decreases.

Figure 8:
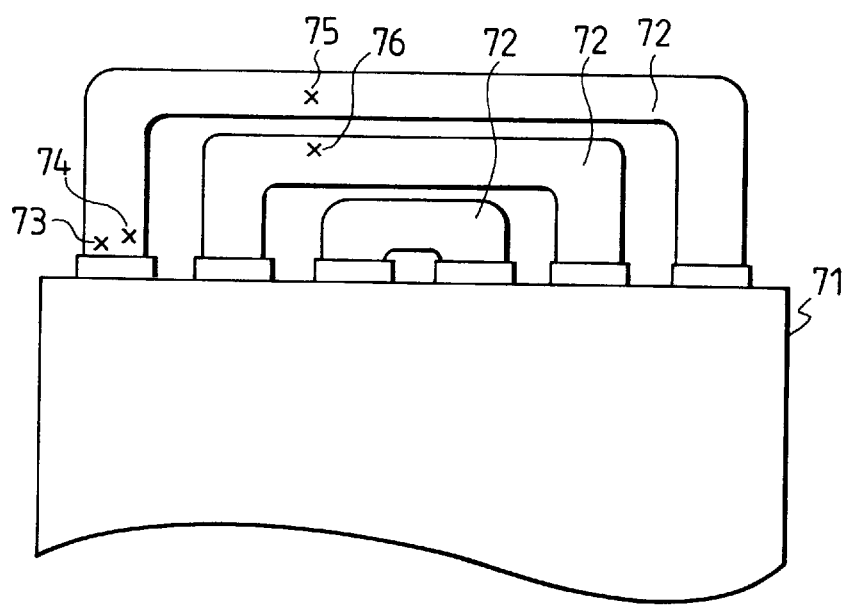
FIG. 8 is an illustration of a prior art showing an example of scratches on windings of coils, which is also used in the embodiment of this invention.

The inventors discovered from experiments that the detection of scratches through detecting a glow discharge is optimized in a range 43 of degrees of vacuum from 65 Torr to 75 Torr through the method of insulation test mentioned above. That is, the degrees of vacuum from 65 to 75 Torr and the insulation test mentioned above incorporate each other to detect the discharge at scratches at a high sensitivity. Moreover, the laminated core 1a is electrically insulated, so that the scratches can be detected irrespective of distances from the laminated core 1a. Therefore, if there are scratches as shown in FIG. 8, the scratches 75 and 76 having a distance of about 1 mm apart from each other and having a distance about 30 mm from the laminated core 1a can be detected at the same time.

Moreover, scratches on coils in a slot of the laminated core 1a can be detected by applying a stress from the surge signal more readily than the method of applying a surge signal in the normal atmospheric pressure.

Moreover, applying the surge signal in the reduced pressure from 65 to 75 Torr provides extremely low impact to the coils, so that a nondestructive insulation test is provided. However, the detection of scratches by the method mentioned above can be provided under a reduced pressure having a range 44 from 1 to 100 Torr. In this case, while decreasing the pressure toward 1 Torr, the sensitivity increases may be detected frequently.

The observation of the discharge will be described more specifically.

Figure 5:
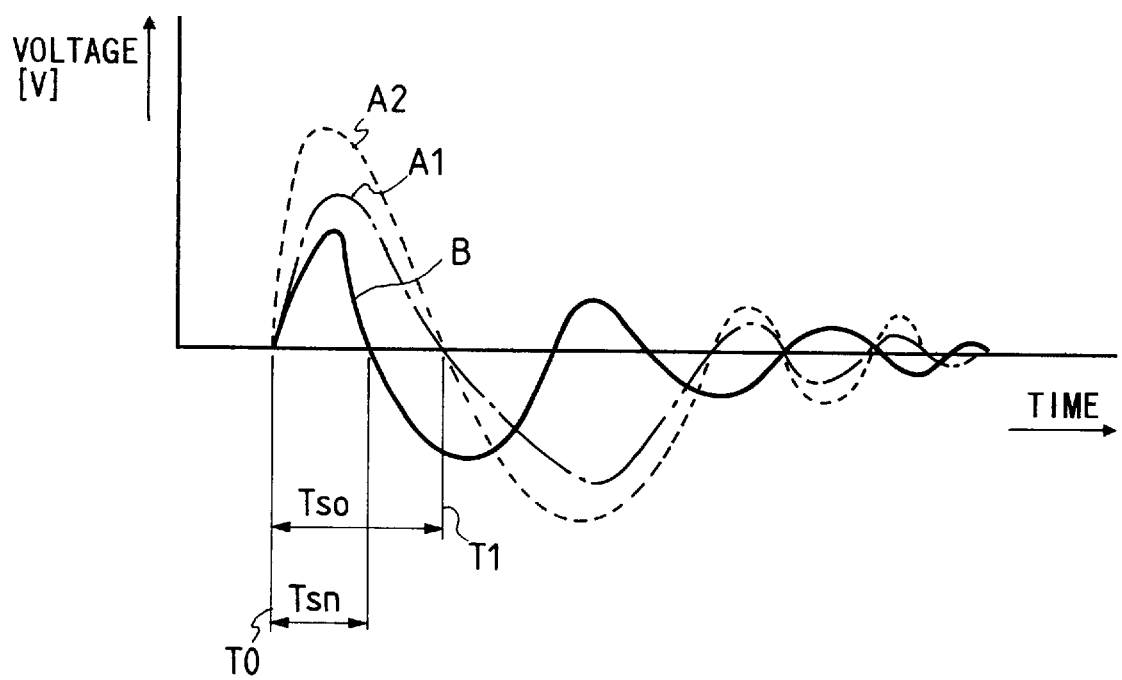
FIG. 5 is a graphical drawing showing waveforms of an output between the of windings.

When the surge signal is applied to one of the coils 1a and 1b, the coil provides the output 61 having a waveform where there is an oscillation. FIG. 5 is a graphical drawing of this embodiment showing a waveform of an output between one of the coils. If there is no scratch on the coils 1b and 1c, no discharge occurs. Therefore, the output signal 61 from the coil supplied with the surge signal provides the waveform A1 or A2. The waveform A1 is provided when a peak voltage of the surge signal is 1000 V and the waveform A2 is provided when the peak voltage of the surge signal is 1500 V.

If there is a scratch on any of the coils, the waveform of the output from the coil supplied with the surge signal is distorted as shown by the waveform B because the inductance is reduced by shortening of the winding due to discharge.

As clearly shown in FIG. 5, a half wave length tso of the output 61 does not change with a variation of the peak voltage of the surge signal. Therefore, if the half wave length of the output shows a reference value tso, there is no scratch on the coils. On the other hand, if the half wave length shows a value tsn shorter than the reference value tso, there is at least a scratch on the coils.

Therefore, this comparison provides the insulation test results with a high sensitivity to all motors manufactured at a high efficiency.

Figure 6:
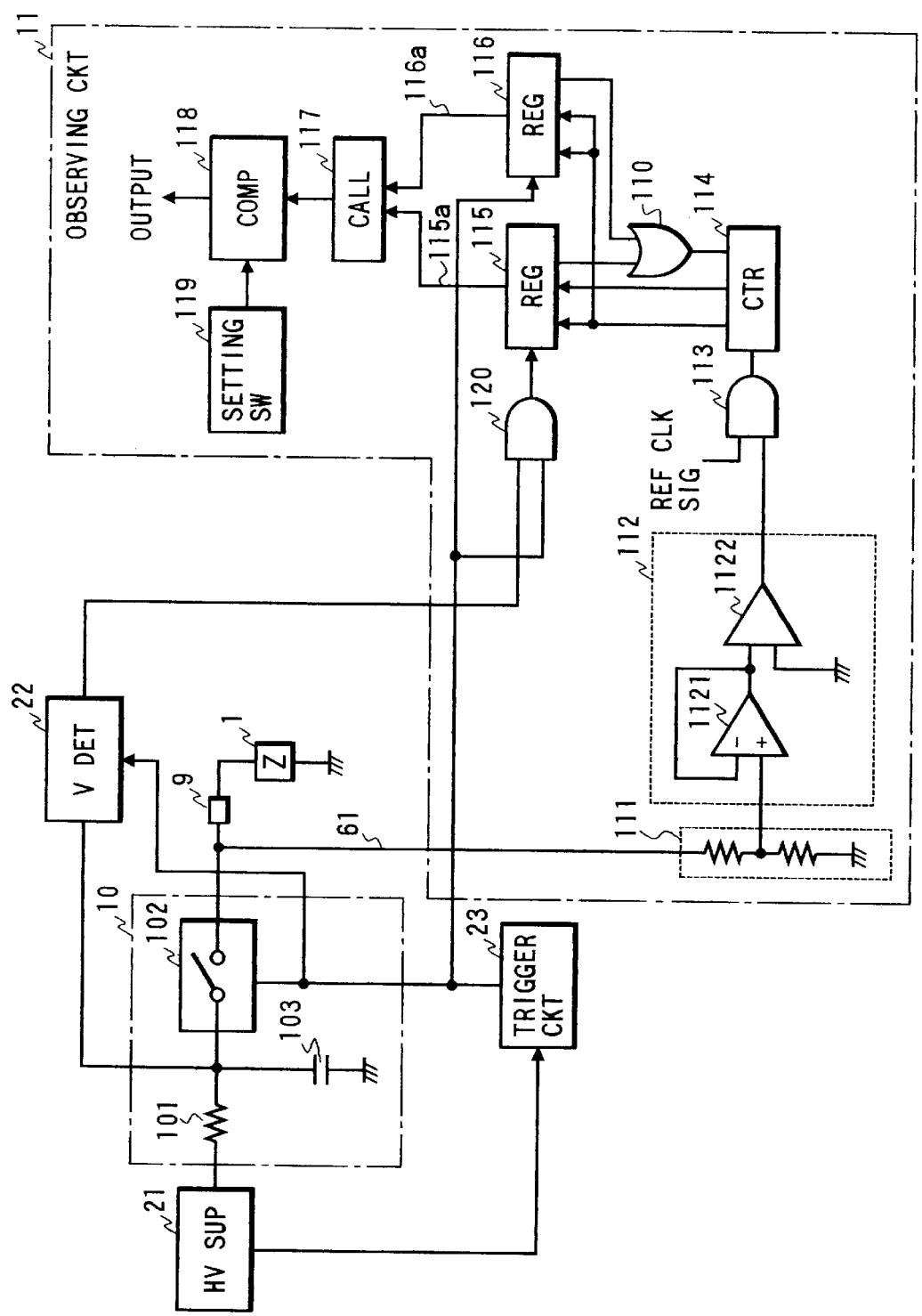
FIG. 6 is a detailed block diagram of the nondestructive insulation testing apparatus of this embodiment.
Figure 7:
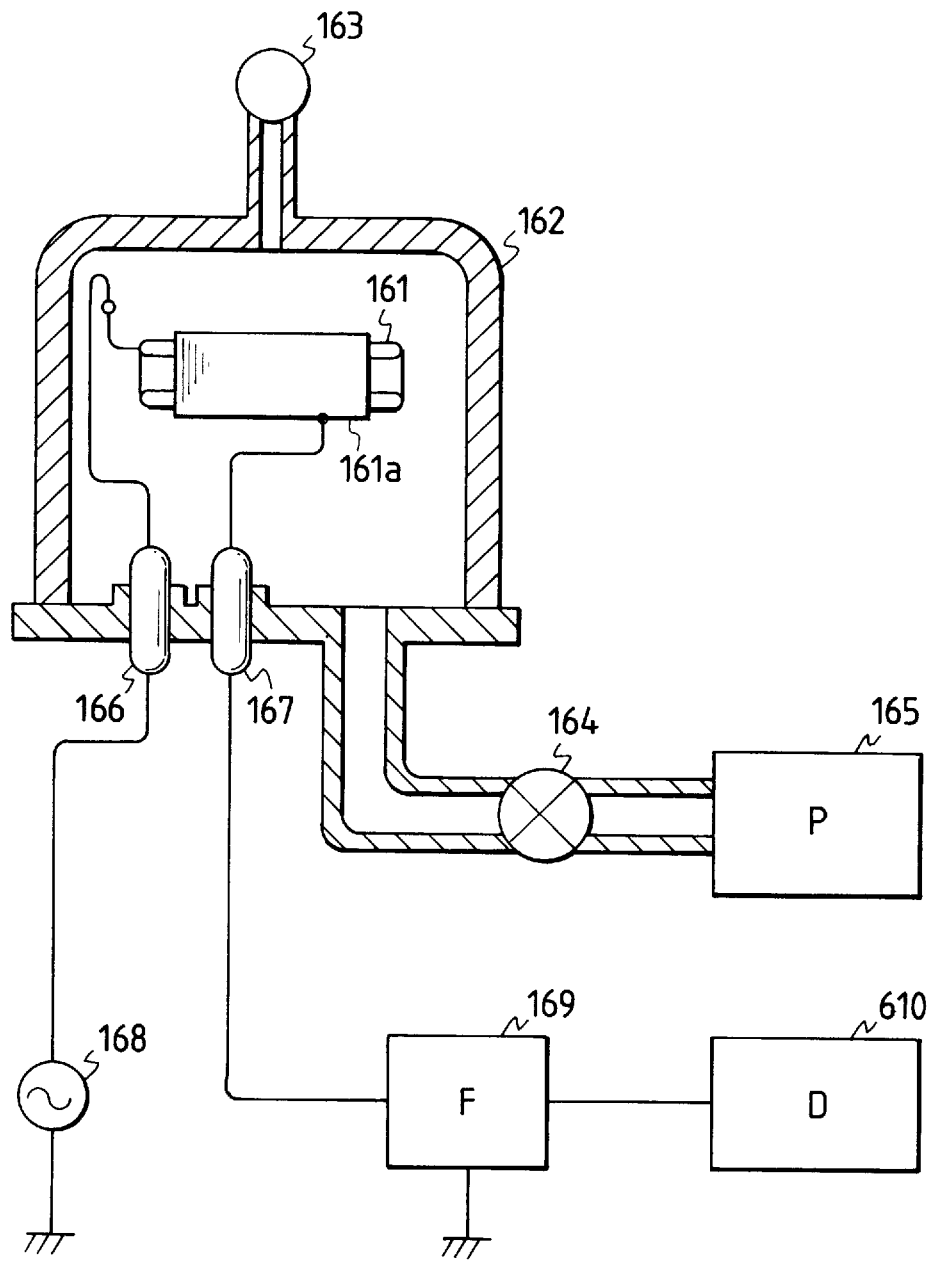
FIG. 7 is an illustration illustrating a prior art method of corona discharge insulation test.

FIG. 6 is a detailed block diagram of the nondestructive insulation testing apparatus of this embodiment.

The high voltage supply 21 generates a high voltage by repeatedly charging a capacitor through a switching operation and a step up transformer from a commercial supply voltage (not shown) to generate a step up voltage toward a target voltage and detects when the output voltage reaches the target voltage which is controllable. The high voltage from the high voltage supply 21 is supplied to the surge signal generation circuit 10. The surge signal from the surge signal generation circuit 10 is supplied to one of the coils of the motor 1 through the switch circuit 9. The surge signal generation circuit 10 comprises a resistor 101 of which one end is connected to the high voltage supply 21 and the other end is connected to one end of a semiconductor switch 102 and to one end of a capacitor 103. The capacitor 103 is charged by the high voltage from the high voltage supply 21 through the resistor 101. When the voltage of the output of the high voltage supply 21 reaches the target voltage, the high voltage supply 21 supplies a charge completion signal to the trigger circuit 23. The trigger circuit 23 supplies a trigger signal to the semiconductor switch 102, the voltage detector 22, the AND gate 120 and to the register 116. The semiconductor switch 102 is turned on in response to the trigger signal to produce the surge signal. Then, the surge signal is generated and supplied to the motor 1. The trigger signal enables the voltage detector 22. Then, the semiconductor switch 102 is opened to charge the capacitor 103. The junction point of the capacitor 103 and the resistor 101 and the semiconductor switch 102 is observed by the voltage detector 22 to detect a peak voltage and detects the peak voltage equal to or less than a predetermined voltage, for example 500 V. A junction point between the semiconductor switch 102 and the switch circuit 9 provides the output signal 61 indicative of the insulation condition of the coils.

The observing circuit 11 comprises a voltage divider 111 for voltage-dividing the output signal 61 of the one of coils supplied to the surge signal, a zero volt detection circuit 112 for detecting a zero volt, an AND gate 113 for affecting an AND operation between an output of the zero volt detection circuit 112 and a reference clock signal having 1 MHz, for example to control outputting the reference clock signal. Also counter 114 counts an output of the AND gate 113, a first register 115 and a second register 116 stores an output data of the counter 114 respectively. An AND gate 120 affects an AND operation between the output of the trigger circuit 23 and an output of the voltage detector 22 indicative of the peak voltage equal to or less than 500 V to supply a register control signal to the first register 115. The second register 116 is controlled by the output of the trigger circuit 23. A calculator 117 for calculates a difference between outputs of the registers 115 and 116, and a comparator 118 compares the difference with a predetermined allowable value set by a setting switch 119 to provide an output indicative of the insulation test.

The high voltage supply 21 detects that the capacitor 101 is sufficiently charged up to the target voltage and outputs the charge completion signal. The trigger circuit 23 generates the trigger signal supplied to the semiconductor switch 102 in response to the charge completion signal.

An operation of the surge signal generation circuit and the observing circuit 11 will be described.

At first, the high voltage supply 21 charges the capacitor 103 to increase a terminal voltage of the capacitor 103. In response to the charge completion signal from the high voltage supply 21, the trigger circuit 23 turns on the semiconductor switch 102 in response to a trigger signal from the trigger circuit 23. Then, the capacitor 103 discharges and supplies the surge signal to one of windings of the motor 1. In response to the trigger signal, the voltage detector 22 detects that a peak voltage is equal to or less than first predetermined voltage, for example 500 V and supplies an output signal to the AND gate 120.

The output signal 61 from one of the windings (coils) is supplied to the voltage divider 111. The voltage divider 111 supplies a divided signal. The zero point detector 112 detects that a voltage of the divided signal is larger than zero, or the ground potential. The zero point detector 112 comprises a buffer amplifier 1112 and a comparator 1122 for comparing an output voltage of buffer amplifier 1121 with the ground potential. The counter 114, which has been cleared in advance by the register 115 or 116, counts pulses of the reference clock via the AND gate 113 while the comparator 1122 detects that the output voltage of the buffer amplifier 1121 is larger than the ground potential. When the output voltage of the buffer amplifier 1121 crosses the zero point, for example, at a timing T1, the zero point detector 112 outputs L, so that the reference clock signal is not supplied to the counter 114. The register 115 stores the output data from the counter 114 in response to the AND gate 120. That is, pulses of the reference clock signal for the interval Tso is stored in the register 115 as a standard value N0. In this condition that the peak voltage of the surge signal is 500 V, though there is a scratch on the surface of the windings, the discharge does not occur. Therefore, this standard value is reliable and this standard value is for the motor 1 to be tested itself.

Then, the value of the supply voltage from the high voltage supply is increased, for example to 1500 V. The output signal resulting from applying the surge signal in the increased supply voltage from the high voltage supply is similarly obtained as a value N1 stored in the register 116 because the counter 115 holding the standard values N0 is disabled by detecting the peak voltage larger than the predetermined voltage of 500V. The calculator 117 subtracts the value N1 from the standard value N0 and the comparator 118 compares the difference with the allowable value dN. When the difference (N0–N1) is smaller than the allowable value dN, the windings of the motor 1 can be judged to be normal. When the difference (N0–N1) is not smaller than the allowable value dN, the windings of the motor 1 can be judged to be abnormal. If the difference is smaller than the allowable value dN, the supply voltage from the high voltage supply is further increased to repeat this test up to 1500 V for example.

As mentioned above, though the supply voltage from the high voltage supply 21 changes, the half wave length of the output signal resulted from applying the surge signal does not change. If there is a scratch on surfaces of the windings of the motor 1, the half wave length becomes shorter than Tso. Then, the difference becomes larger than the allowable value dN, so that the scratch can be detected. Therefore, scratches 1 to 2 mm apart from each other on surfaces of insulation coats on windings can be detected though the scratch is more than 10 mm apart from the laminated core by applying the insulation test according to this invention to all produced motors 1.

Figure 9:
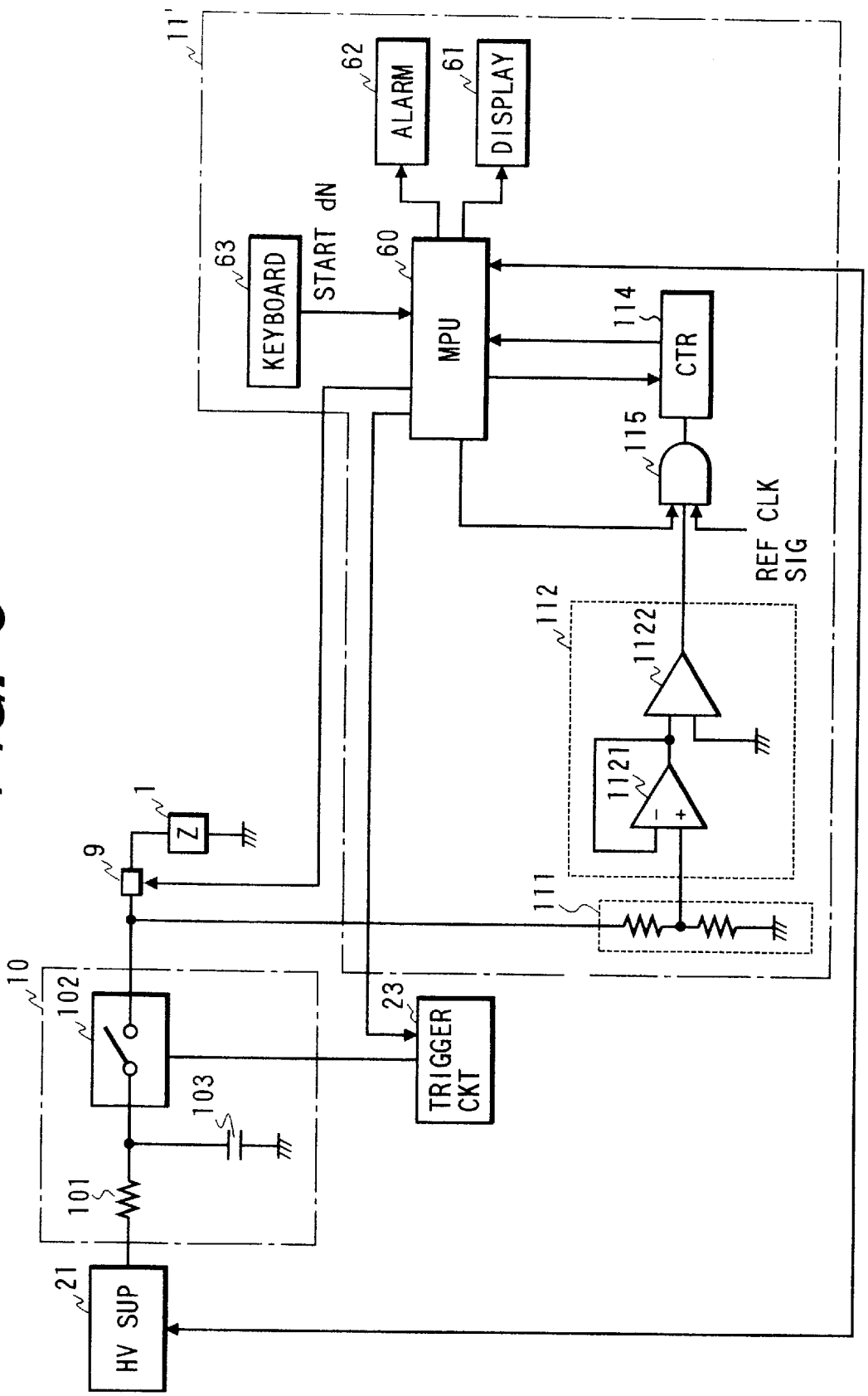
FIG. 9 is a block diagram of a modification of this embodiment of the nondestructive insulation testing apparatus which uses a microprocessor.

FIG. 9 is a block diagram of a modification of the nondestructive insulation testing apparatus of this embodiment which uses a microprocessor 60. The basic structure is the same as the nondestructive insulation testing apparatus shown in FIG. B. The differences are as follows:

The microprocessor 60 replaces the registers 115 and 116, the AND gate 120, the calculation circuit 117, the comparator 118, and the setting switch 119 and the AND gate 113 is replaced by an AND gate 115 having three inputs. On the other hand, the voltage detector 22 is eliminated. The microprocessor 60 responds to a key board 63 to receive a start command and the allowable value dN, and the counter 114 to receive the counted values N0 and N1. The microprocessor 60 operates the high voltage supply 21 to output the supply voltage having the target voltage, the switch circuit 9 to successively connect one of windings to have the connection patterns I to IV, the AND gate 115 to enable the AND gate 115, the counter 114 to clear the count value in the counter 114, an alarm circuit 62 to generate an alarm signal, and a display 61 to indicate the measurement result.

Figure 10:
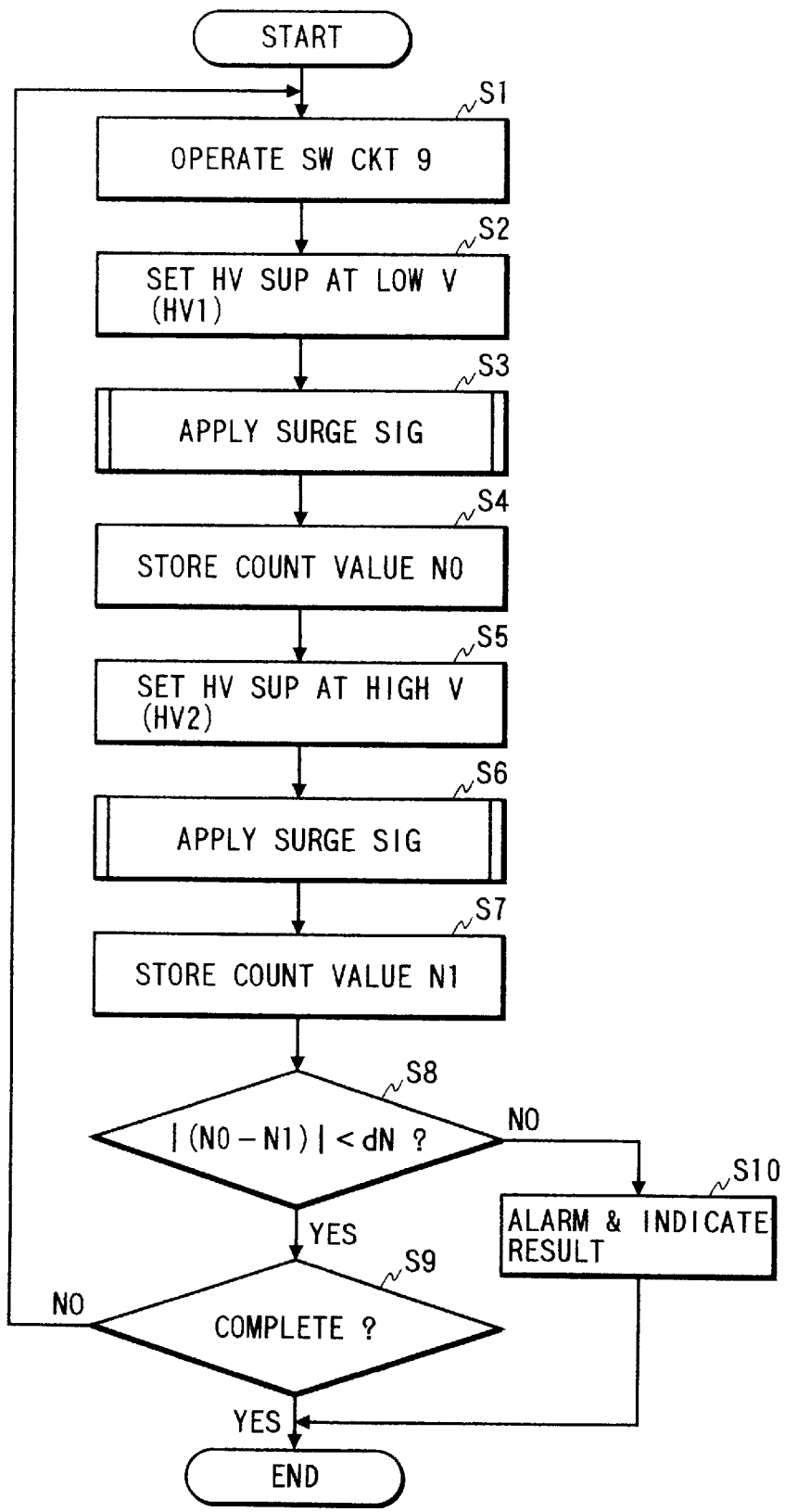
FIGS. 10 and 11 are diagrams of flow charts of the modification of this embodiment.
Figure 11:
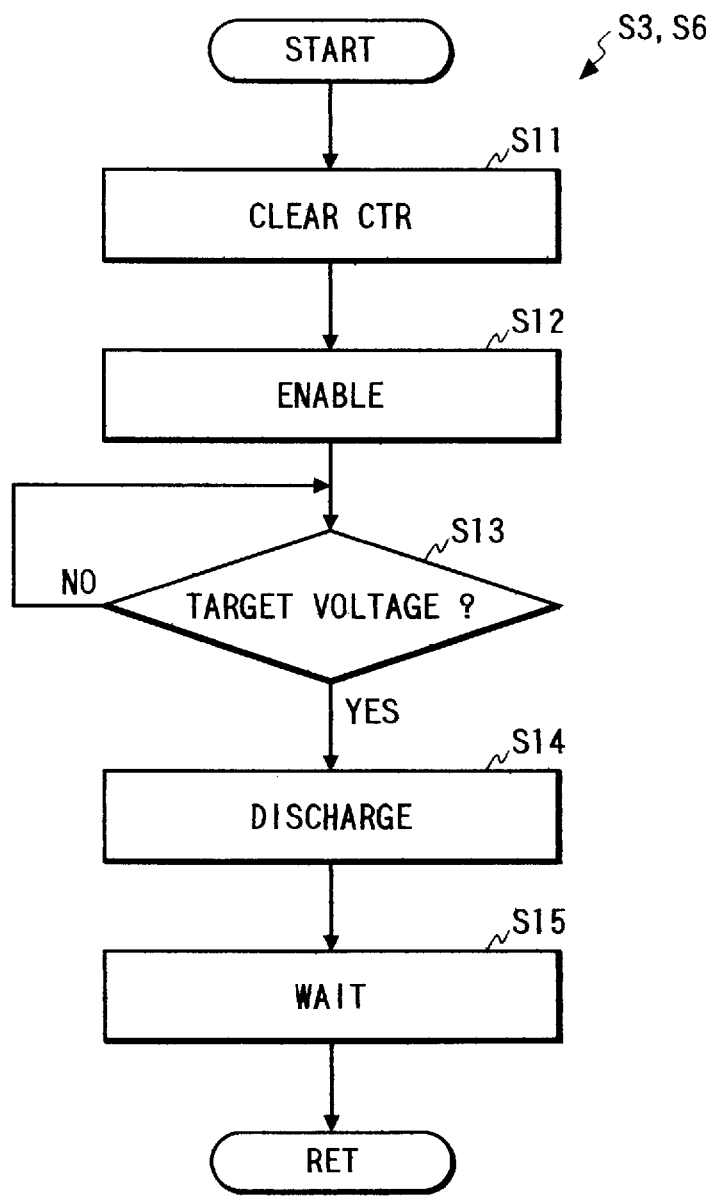

FIGS. 10 and 11 are flow charts of the modification of this embodiment.

The microprocessor 60 operates the switch circuit 9 to connect one of windings to the semiconductor switch 102 in step s1. In step s2, the microprocessor 60 sets the high voltage supply 21 to a relative low target voltage HV1, for example 500 V. In the following subroutine s3 the microprocessor 60 applies the surge signal to detect the half wave length. Then, the microprocessor 60 stores the value N0 as the standard value of the half wave length. In step s5, the microprocessor 60 sets the high voltage supply 21 to a relative high target voltage HV2, for example 1500 V. In the following subroutine s6, the microprocessor 60 applies the surge signal to detect the half wave length. Then, the microprocessor 60 stores the value N1 as the measured value of the half wave length.

The microprocessor 60 judges whether or not the count value is normal by calculating a difference between N0 and N1 is smaller than the allowable value dN. If the count value is normal, processing proceeds to step s9. In step s9, the microprocessor 60 makes a decision as to whether or not all connection patterns I to IV have been made. If all connection patterns I to IV have been made, processing ends. If all connection patterns I to IV have not been made, processing returns to step s1 to perform the above mentioned insulation test under the next connection pattern. In step s8, if the counted value N1 is not allowable, the microprocessor 60 operates the alarm circuit 62 to alarm an operator and indicates the insulation test result.

The output voltage of the high voltage supply 21 may be increased gradually as mentioned earlier. The allowable value dN can be changed by inputting a new allowable value using the keyboard 63.

FIG. 11 shows the subroutines s3 and s6. The microprocessor 60 clears the counter 114 in step s11. In the following step s12, the microprocessor 60 enables the AND gate 115. The microprocessor 60 checks whether or not the terminal voltage of the capacitor 103 reaches the target voltage (500 or 1500V) in step s13 by detecting the charge completion signal from the high voltage supply 21. When the terminal voltage reaches the target voltage in step s13, the microprocessor 60 operates the semiconductor switch 102 to discharge the capacitor 103 to supply the surge signal to the motor 1. In step s15, the microprocessor 60 waits a predetermined interval and returns to the main routing shown in FIG. 10, that is, to step s4 or step s7.

The microprocessor 60 may further operate the vacuum pump 5 with the vacuum gauge 3 monitored.

As mentioned above, the method of nondestructive insulation testing is provided which comprises the steps of: (a) placing the motor 1, having the laminated core 1a and windings provided to the laminated core 1a, in the reduced atmospheric pressure 43; (b) insulating the laminated core 1 from the ground by the holder 51; (c) supplying a voltage signal having the surge waveform 40 having the peak voltage HV2 to the winding; and detecting a glow discharge which may be resulted from step (c) to detect an insulation condition of the winding.

In the method of nondestructive insulation testing, the reduced atmospheric pressure 43 ranges from 65 to 75 Torr.

In the method of nondestructive insulation testing, the voltage signal is applied in the first direction of the at least a winding and then, is applied in the second, opposite, direction of a winding.

The method of nondestructive insulation testing may further comprise the steps of: (d) supplying a second voltage signal having a second predetermined surge waveform having the peak voltage HV1 lower than the peak voltage HV2 of the predetermined surge waveform; (e) outputting the second output signal between the winding indicative of the second insulation condition of the winding in response to step (d); (f) measuring intervals Tso and Tsn corresponding to wavelengths of the output signal and the second output signal respectively; and (g) judging the insulation condition by comparing the measured intervals to each other.

Moreover, the nondestructive insulation testing apparatus of this embodiment for detecting an insulation condition of a motor 1 as an electric device, having a plurality of windings, insulated from the ground at a reduced atmospheric pressure, which comprises: a surge voltage signal generation circuit 10 for supplying a voltage signal having a predetermined surge waveform 40 having a peak voltage HV2 to one of the windings; and a signal output circuit 61 for outputting an output signal between one the windings indicative of an insulation condition of the winding.

The surge voltage signal generation circuit 10 further supplies a second voltage signal having a second predetermined surge waveform having a second peak voltage HV1 lower than the peak voltage HV2 of the predetermined surge waveform 40, the signal output circuit for outputting the second output signal 115a between the winding indicative of a second insulation condition of the winding, the measuring circuit, including the AND gate 113 and the counter 114 for detecting intervals N0 and N1 corresponding to wavelengths of the output signal and the second output signal respectively, and the judging portion comprising a comparator 118 for judging the insulation condition by comparing the measured intervals to each other.

The nondestructive insulation testing apparatus may further comprise: the vacuum container 2 for airtightly containing the motor 1; the vacuum pump 5 for generating the reduced atmospheric pressure in the vacuum container 2; and the holder 51 or 52 for holding the electric device 1 in a predetermined insulated condition from the ground. Moreover, the motor 1 comprises a plurality of windings having lead wires 12 to 14 and the vacuum container 2 has a through hole 7b for piercing the lead wires to couple the motor 1 to the surge signal generation circuit 10 and the outputting circuit air-tightly.

What is claimed is:

1. A method of nondestructive insulation testing, comprising the steps of:
    (a) placing an electric device having a core and at least one winding provided on said core in a reduced atmospheric pressure;
    (b) insulating said core from the ground;
    (c) supplying a voltage signal having a surge waveform to said winding; and
    detecting a glow discharge which may result from step (c) to detect an insulation condition of said winding.

2. A method as claimed in claim 1, wherein said reduced atmospheric pressure ranges from 1 to 100 Torr.

3. A method as claimed in claim 1, wherein said reduced atmospheric pressure ranges from 65 to 75 Torr.

4. A method as claimed in claim 1, wherein said voltage signal is applied in a first direction of said one winding and then, is applied in a second, opposite, direction of said winding.

5. A method as claimed in claim 1, further comprising steps of:
    outputting a first output signal between ends of said winding indicating said insulation condition;
    (d) supplying a second voltage signal having a second predetermined surge waveform having a peak voltage lower than a peak voltage of said surge waveform;
    (e) outputting a second output signal between ends of said winding indicative of a second insulation condition of said winding in response to step (d);
    (f) measuring intervals corresponding to wavelengths of said first output signal and said second output signal respectively; and
    (g) judging said insulation condition through comparing said measured intervals to each other.

6. A nondestructive insulation testing apparatus for detecting an insulation condition of an electric device, having at least one winding, insulated from the ground at a reduced atmospheric pressure comprising:
    means for insulating said electric device from ground:
    means for maintaining said electric device at a reduced atmospheric pressure;
    surge voltage signal supplying means for supplying a first voltage signal having a predetermined surge waveform to said winding; and
    signal output means for outputting an output signal between ends of said winding having a wavelength indicative of an insulation condition of said winding.

7. A nondestructive insulation testing apparatus as claimed in claim 6, further comprising a second surge voltage signal supplying means for supplying a second voltage signal having a second predetermined surge waveform having a second peak voltage lower than a peak voltage of said predetermined surge waveform, second signal output means for outputting a second output signal between ends of said winding indicative of a second insulation condition of said winding in response to said second surge voltage signal supplying means, measuring means for detecting intervals corresponding to wavelengths of said output signal and second output signal respectively, and judging means for judging said insulation condition by comparing said measured intervals to each other.

8. A nondestructive insulation testing apparatus, as claimed in claim 6, wherein said means for maintaining said electric device at a reduced atmospheric pressure comprises:
    containing means for airtightly containing said electric device;
    pressure reducing means for generating said reduced atmospheric pressure in said containing means; and
    holding means for holding said electric device in a predetermined insulated condition from the ground.

9. A nondestructive insulation testing apparatus, as claimed in claim 8, wherein said winding comprises a plurality of windings having lead wires and said containing means has through hole means through which said lead wires extend to couple said electric device to said surge signal generation means and said outputting means air-tightly.

* * * * *